United States Patent [19]

Paretti

[11] 4,025,718

[45] May 24, 1977

[54] METHOD AND APPARATUS FOR RECORDING IN A MEMORY TRAJECTORIES AND TRACES OF OBJECTS

[75] Inventor: Claudio R. Paretti, Rome, Italy

[73] Assignee: Comitato Nazionale per l'Energia Nucleare, Rome, Italy

[22] Filed: Dec. 2, 1975

[21] Appl. No.: 637,013

[30] Foreign Application Priority Data

Dec. 10, 1974 Italy .................................. 54455/74

[52] U.S. Cl. ................................ 358/280; 358/105; 358/108; 358/125

[51] Int. Cl.² .......................................... H04N 7/18

[58] Field of Search ............. 178/DIG. 21, DIG. 33, 178/DIG. 38, DIG. 37, 6.8

[56] References Cited

UNITED STATES PATENTS

| | | | |
|---|---|---|---|
| 3,507,992 | 4/1970 | Foote | 178/DIG. 33 |
| 3,527,880 | 9/1970 | Gordon | 178/DIG. 33 |
| 3,679,823 | 7/1972 | Corrigan | 178/DIG. 37 |
| 3,835,247 | 9/1974 | Soames | 178/DIG. 37 |
| 3,908,078 | 9/1975 | Auerbach | 178/DIG. 37 |

*Primary Examiner*—Richard Murray
*Assistant Examiner*—Edward L. Coles

*Attorney, Agent, or Firm*—Stevens, Davis, Miller & Mosher

[57] ABSTRACT

A method and an apparatus for storing in a digital memory the information obtained by comparing by means of a logical operator any information previously stored in said memory with the information originating from a television camera. Specifically a method and an apparatus for storing in a digital memory the plane projection of a trace left by a particle on a transparent medium or the plane projection of the trajectory of an object moving through the space along with the stationary objects with respect to which said object is moving or without said stationary objects.

The apparatus comprises a television camera for scanning the picture to be memorized, an analog-digital converter for converting the signals from the telecamera into digital signals, a digital memory for processing said digital signals, an inclusive-OR logical operator for supplying to said memory the image of a trace or trajectory along with the background of stationary objects, an exclusive-OR for forming in said memory the image of a trajectory without the stationary background, a switch for shifting the apparatus from operating through said inclusive-OR or through said exclusive-OR and vice-versa.

6 Claims, 5 Drawing Figures

METHOD AND APPARATUS FOR RECORDING IN A MEMORY TRAJECTORIES AND TRACES OF OBJECTS

This invention is concerned with a method and apparatus for recording in a digital memory the image projected on a plane of the trajectory of one or more objects that are in motion at the time when they are tracked, or that in their movement in previous time have left a trace detectable by means of an optical system.

According to the invention, a single apparatus is used for both the recording of traces and trajectories and the recording of trajectories with the simultaneous erasing of the stationary background, that is the stationary objects against which is moving the object whose trajectory is to be tracked, said apparatus being easily convertible from the former to the latter application by simply actuating a switch.

The basic principle of the invention consists in comparing a television image originating from a television camera with an image previously stored in a memory and in entering into the same memory the result of the comparison between the two images.

In the case of the analysis of a trajectory, the successive images that are entered into the memory are images of the moving object viewed at successive times, preferably at a regular rate, through a same optical system; in the case of the analysis of a skew trace, the successive images reaching the memory are images viewed through an optical system which is focused on planes preferably equidistant, besides being of course parallel to each other and perpendicular to the axis of the optical system.

The method and apparatus forming the object of the invention are particularly suitable for the analysis of trajectories of objects or particles, both in the case of the trajectories leaving no trace and in that of the trajectories having materialized in traces left by the particles moving through a medium permeable thereto, such as a nuclear emulsion.

In the case in which the object of the analysis is the trace of a particle in a nuclear emulsion, the optical analysis system consists of a high-magnification microscope which is focused on the particle trace on equidistant planes, thus tracking the said trace in the successive parallel layers of the emulsion.

In both of such cases the images are converted into electrical signals by a television camera, converted into digital signals by an analog/digital converter, and processed by a digital memory in the manners more fully described hereinafter.

The method and apparatus forming the object of this invention are particularly suitable for the automatic counting of particle traces in nuclear emulsions for which, given the need for a strong microscopic magnification, with the techniques heretofore used only a partial focusing of said traces is obtained. In this particular application, the procedure according to the invention consists in placing the television camera on the microscope with which the emulsion is viewed, successively focusing on the various emulsion layers and recording in the memory, by means of the apparatus covered by the invention, the images of each of such layers focused, superimposing same on the images relating to the other layers that had been previously stored in the memory. At the end of the operation, there will be found stored in the memory a plane image corresponding to the projection, on a plane perpendicular to the optical axis, of the full thickness of the emulsion.

This operation is carried out by comparing from time to time the memory-stored information with the information originating from the television camera, it being unnecessary to memory-store all data relating to the various sections focused prior to proceeding with their logic processing. A substantial saving in memory capacity is thus achieved.

In both of the aforesaid applications the method consists in recording in the memory the television image after converting it into a matrix of logic 0s and 1s correspondingly to the grey level relating to the grid of elementary areoles into which the image is subdivided by means of the television camera's line scanning and of the standard signal supplied by a clock synchronized with the line pulses. The stored datum corresponding to a given areole is read and compared with the datum transmitted by the television camera relating to the same areole, and the result of the comparison is recorded in the memory location corresponding to the areole being examined. The comparison operation consists in the application of a logical operator between two signals, respectively from the memory output and incoming from the television camera, through suitable processing circuits.

If the logical operator used is an inclusive OR, the resulting image contains both the previously stored data and those supplied by the television camera. If the operator used is an exclusive OR, the resulting image does not contain the data which do not belong simultaneously to the stored image and the image supplied by the television camera.

In this case the objects moving relative to the area formed by the television camera leave in the memory a trace of the path relative to the grid into which the image is subdivided.

Therefore, for the forming in the memory of the image of a trace or trajectory the inclusive-OR operator is used, while to obtain the image of a trajectory without the stationary background against which the particle moves the exclusive-OR operator is used. The changeover from one to the other type of circuit is achieved by actuating the aforesaid switch.

In other terms, as concerns the trajectories of moving objects, the method and apparatus covered by the invention make it possible both to isolate, meaning to make evident, the trajectory of the moving object with respect to the background image, and to track it on the complete image (background + trajectory). Moreover, given the reading speed and the capability of the apparatus to be connected with a computer, this method and apparatus constitute a major advance over the stroboscopic and photographic methods now in use, wherein the preparation of the data to be fed into the computer often proves onerous.

The invention will be more clearly understood from the following description and from the enclosed drawings which, by way of non-limiting example, represent one preferred embodiment thereof. In the drawings.

Figure 1:
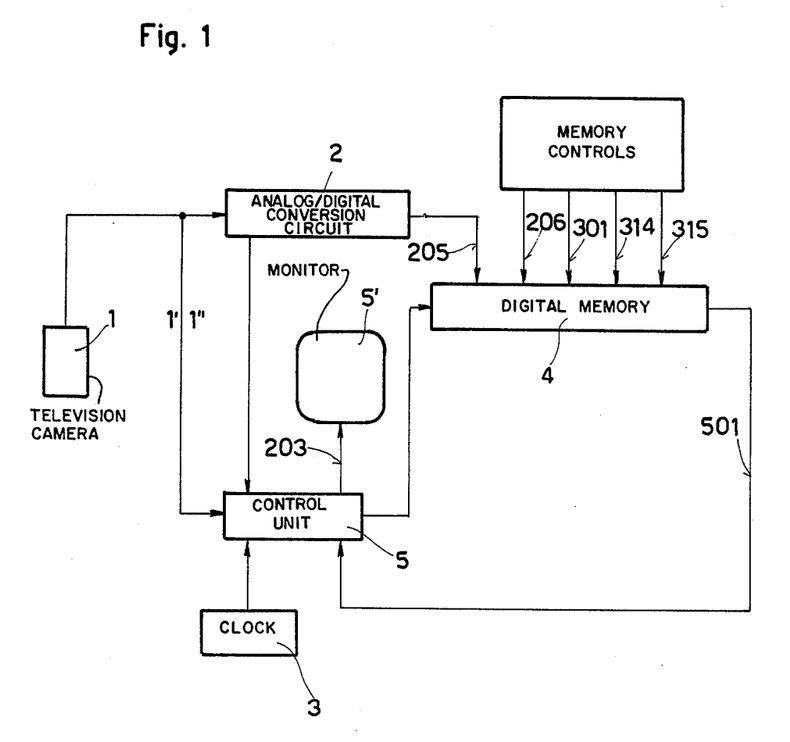
FIG. 1 is a block diagram of the apparatus forming the object of this invention.

With reference to FIG. 1, the apparatus covered by the invention comprises the following units: a television camera 1, an analog/digital conversion circuit 2, a clock 3 synchronized with the television camera's line pulses, a digital memory 4, a control unit 5 supplying the synchronizing signals between the video signals from television camera 1 and the memory data reading and printing controls, and a monitory device 5'.

Figure 2:
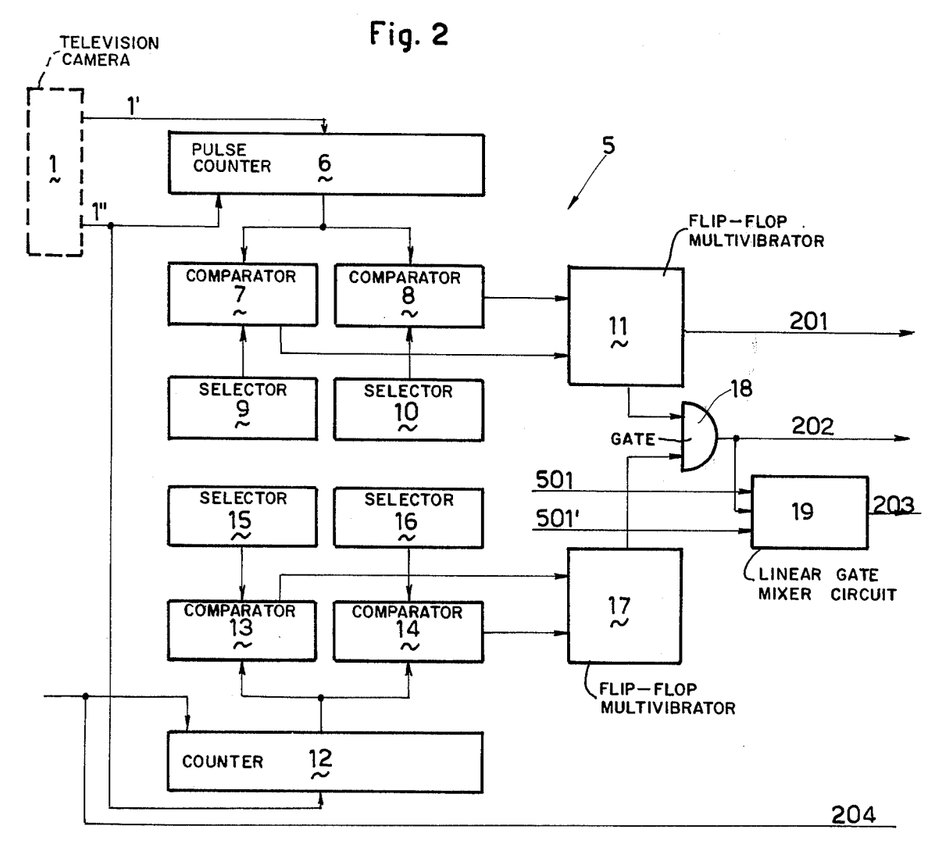
FIG. 2 is a block diagram of the circuit of the control unit forming part of the apparatus covered by the invention.
Figure 3:
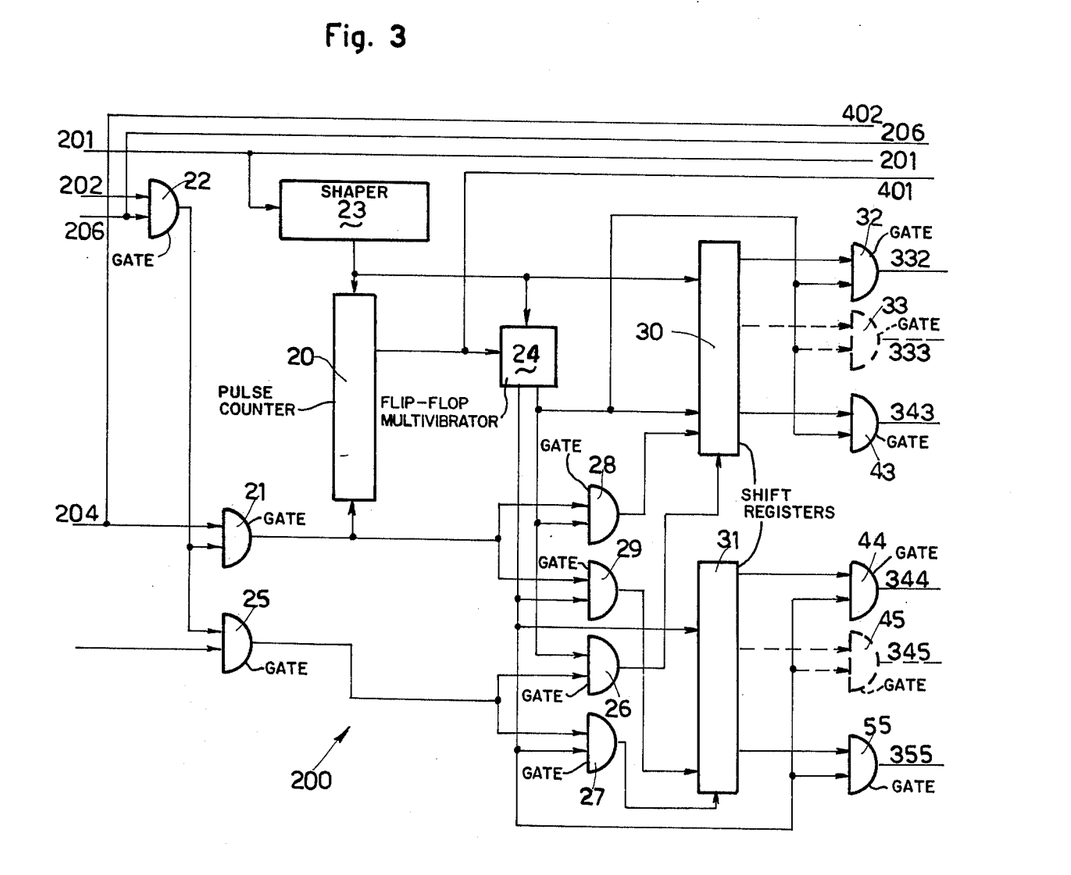
FIGS. 3 and 4 show an outline of the memory unit forming part of the apparatus covered by this invention.
Figure 4:
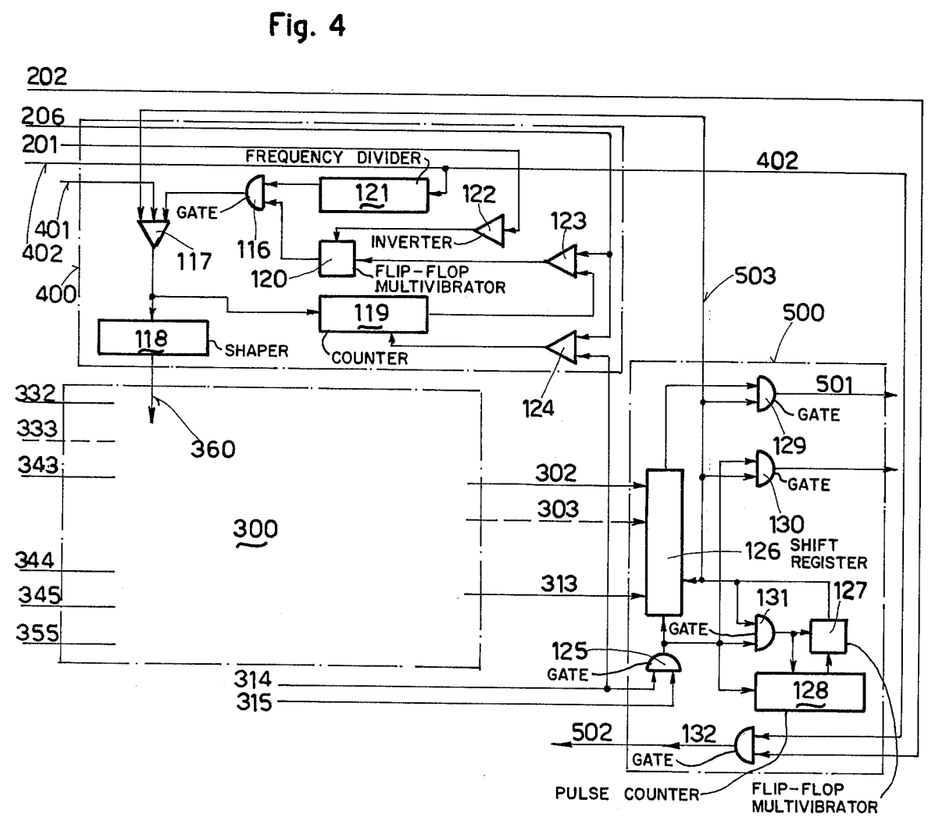
Figure 5:
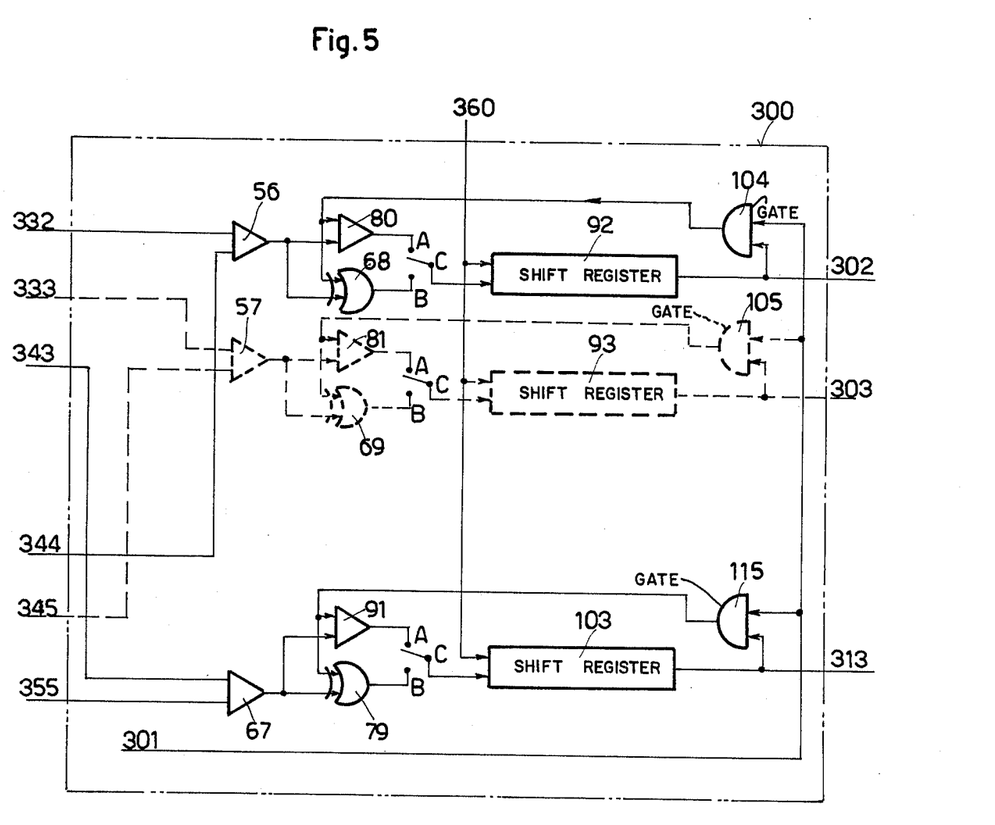
FIG. 5 is a detail of the memory unit shown in FIG. 4.

Some of the units listed above are well known and commercially available, and therefore their description is omitted. The following units, instead, will be described in detail below:

a — control unit 5 (FIG. 2) and
b — digital memory 4 (FIGS. 3, 4 and 5).

Control unit 5 comprises a pulse counter 6 whose function is to count the line pulses incoming through line 1" from television camera 1 forming part of a closed circuit. The output of counter 6 is connected to two comparators 7 and 8 whose function is to compare the figure supplied by counter 6 with the figures originating from two selectors 9 and 10. Comparators 7 and 8 are connected with a flip-flop multivibrator 11 capable of being switched by a pulse originating from comparator 7 when counter 6 reaches the value selected by selector 9 and of being restored to the initial state by a pulse emitted by comparator 8 when the same recognises that the number selected by selector 10 matches that reached by counter 6. Control unit 5 further comprises a circuit similar to that described above to process the pulses from the synchronous clock. This second circuit therefore comprises a counter 12, two comparators 13 and 14 and two selectors 15 and 16.

The outputs of comparators 13 and 14 are connected with a flip-flop multivibrator 17. The outputs of flip-flop multivibrators 11 and 17 are connected to a first AND gate 18. The latter is connected with linear-gate mixer circuit 19 connected in turn to a monitor device 5' via line 203. The other two inputs of mixer circuit 19 are connected respectively to the output of decoder unit 501 (see below) and to the video signal from the television camera.

Memory unit 4 (FIGS. 3, 5 and 4) is formed by the following assemblies:

a — a dispatching unit 200 (FIG. 3);
b — a MOS memory assembly 300 (FIG. 5);
c — a positioning unit 400 (FIG. 4);
d — a decoder unit 5500 (FIG. 4).

Dispatching unit 200 comprises a module-12 electric pulse counter 20 connected to the output of flip-flop multivibrator 11 via a shaper 23 and line 201, and to the output of a second AND gate 21.

One of the inputs of gate 21 and of a third AND gate 25 is connected to the output of a fourth AND gate 22, while the other outputs of said AND gates 21 and 25 are connected respectively to synchronous clock 3 via line 204 and to the A/D converter via line 205 (FIG. 1).

The inputs of AND gate 22 are connected to the output of AND gate 18 via line 202 and to the external memory writing control via line 206.

Counter 20 is also connected to flip-flop multivibrator 24 whose "true (Q)" and "negated ($\overline{Q}$)" outputs are connected respectively to one of the two inputs of a fifth AND gate and of a sixth AND gate (respectively 28 and 26) and to a first input of a first shift register 30 and $\overline{Q}$ to one of the two inputs of a seventh and a eighth AND gate (respectively 29 and 27) and to a first input of a second shift register 31, while the other of the two inputs of each of gates 28 and 29 is connected to the output of the second AND gate 21 and the other of the two inputs of each of gates 26 and 27 is connected to the output of the third AND gate 25.

The output of the fifth gate 28 is connected to a first input (clocking) of the first shift register 30, the output of the eighth gate 27 is connected to a second input of the second shift register 31, and the output of the seventh gate 29 is connected to a third input (clocking) of the second shift register 31.

The output signal Q from flip-flop multivibrator 24 is also fed to one of the two inputs of each gate of a first group of 12 AND gates 32 through 43, while the other input of each of the latter 12 gates is connected to corresponding outputs of the first shift register 30.

The output signal $\overline{Q}$ is also fed to one of the two inputs of each of the gates of a second group of 12 AND gates 44 through 55, while the other input of each of the latter 12 gates is connected to corresponding outputs of the second shift register 31.

The MOS memory assembly 300 comprises (FIG. 5) a first group of 12 "inclusive-OR" circuits 56 through 67 and 12 "exclusive-OR" circuits 68 through 79 and a second group of 12 inclusive-OR circuits 80 through 91.

The first group of 12 inclusive-OR circuits, 56 through 67, is connected to both of the aforesaid groups of 12 AND gates, i.e. to the first group of gates 32 through 43, via lines 332 through 343 and to the second group of gates 44 through 55 via lines 344 through 355 in the following manner:

One of the two inputs of the first circuit 56 of the first group of inclusive-OR circuits is connected to the outputs of the first gate 32 of the first group via line 332.

The second input of the said circuit 56 is connected to the output of the first gate 44 of the second group of gates via line 344. One of the two inputs of the second circuit 57 of the first group of inclusive-OR circuits is connected via line 333 to the output of the second gate 33 of the first group of AND gates, the second input of the said circuit 57 is connected via line 345 to the output of the second gate 45 of the second group of AND gates, and so forth.

The output of each inclusive-OR circuit (for instance 56) is connected to one of the inputs of one of the circuits of the second inclusive-OR group (for instance 80) and to one of the inputs of one of the circuits of the exclusive-OR group (for instance 68). The outputs of the inclusive-OR and of the exclusive-OR circuits thus connected are connected to one of the outputs of a shift register 92 of a group of twelve 150-bit shift registers, 92 through 103, via a switch which, in position A, connects to the shift register the output of the corresponding inclusive-OR circuit 80, while in position B connects to the shift register the output of the corresponding exclusive-OR circuit 68.

Similar connections are provided for the successive logical circuits 57 through 67, 81 through 91, 69 through 79 and the respective shift registers 93 through 103.

The 12 ABC switches are actuated simultaneously.

The outputs of the 12 shift registers 92 through 103 are connected to one of the inputs of 12 AND gates 104 through 115, while the other input of the said gates is connected to a sum control (external) via line 301.

The outputs of the 12 AND gates are connected to one of the inputs of all inclusive-OR circuits of the 80 through 91 group and to one of the inputs of all exclusive-OR circuits of the 68 through 79 group.

The function of positioning unit 400 (FIG. 4) is to synchronize the image stored in shift registers 92 through 103 with the image from the television camera and present at the output of the OR circuits 56 through 67.

It consists of a counter 119 which receives at its input the clocking pulses from OR circuit 117. The inputs of the OR circuit 117 are connected respectively to the output of counter 20 via lina 401, to the output of decoding unit 500 via line 503, and to the output of an AND gate 116. The inputs of the latter gate are connected to the output of a frequency divider 121, whose input is connected to the clocking circuit via line 402. The other input of AND gate 116 is connected to the output of a flip-flop multivibrator 120 whose inputs are connected respectively to the output of an inverter 122 and to the output of an OR circuit 123. The input of inverter 122 is connected via line 201 to the output of the flip-flop multivibrator 11.

One of the two inputs of the OR circuit 123 is connected via line 206 to an external writing control; the other input of this circuit is connected to the output of counter 119. The resetting input of counter 119 is connected to the output of inclusive-OR circuit 124 whose inputs are the aforesaid writing control fed in via line 206 and an external reading control fed in via line 314. The output pulses from OR circuit 117 are fed to the input of a shaper 118 whose output is connected with the clocking inputs of shift registers 92 through 103.

The function of decoder unit 500 is to pick up in parallel the signals supplied by the 12 shift registers 92 through 103 and then transmit them to the output in sequential form.

It consists of: a shift register 126 to which are connected the outputs of 12 shift registers, 92 through 103, via lines 302 through 313. Furthermore, to the same register are connected the output of AND gate 125 and the output of flip-flop multivibrator 127 and specifically the former to the clocking input and the second to the input of a series and/or parallel operation control. The output of AND gate 125 is connected to the counting input of a 12-position counter 128 and to one input of AND gate 131. The inputs of AND gate 125 are connected respectively to the external memory reading control via lines 314 and to the external clock via lines 315. The other input of AND gate 131 is connected to the output of flip-flop multivibrator 127. The output of AND gate 131 is connected to the resetting input of counter 128 and to one of the two inputs of flip-flop multivibrator 127. The other input of flip-flop multivibrator 127 is connected to the output of counter 128. The output of flip-flop multivibrator 127 is also connected to the first inputs of two AND gates 129 and 130. The second input of AND gate 129 is connected to the series output of shift register 126, while the second input of AND gate 130 is connected to the output of AND 125. Lines 202 and 402 supply AND gate 132 respectively with clocking signals nd with the field control signal. AND gate 132 generates auxiliary output 502 which, when the monitory device is used, is connected to line 315.

OPERATION

The control unit 5 (FIG. 1) is adjusted to delimit the portion of frame which we shall call field, the image from which is to be processed. This operation is performed by setting selectors 9 and 10 which determine the number of lines contained in the field and selectors 15 and 16 which determine the limits of the line.

Electric pulse counter 6 counts the line pulses picked out of the closed-circuit system through line 1'' and is reset to zero at each field pulse, also originating from television system 1 through line 1'. The outputs from counter 6 are fed to the two comparators 7 and 8 which, respectively compare the figure supplied by counter 6 with the figures set on selectors 9 and 10. When counter 6 has reached the value set by selector 9, comparator 7 sends a pulse to flip-flop multivibrator 11 and switches it; thus flip-flop multivibrator 11 in its active state shows that the electron beam is moving along one of the lines comprised in the field. Flip-flop multivibrator 11 is returned to its initial state when comparator 8 sends out the pulse indicating that the figure selected by selector 10 matches that reached by counter 6.

The circuit made up by counter 12, comparators 13 and 14 and selectors 15 and 16 operates in an identical manner, except for the fact that the electrical pulses counted by counter 12 are the pulses supplied by synchronous clock 3. By counting the clocking pulses from the instant when the line begins, the position of the electron beam within the limits of the line can be determined. Hence, counter 12 continuously tracks, instant by instant, the position of the beam and comparators 13 and 14, as well as selectors 15 and 16 determine the position of the limits of the line section falling within the field. Counter 12 is reset to zero for each line of scanning by the pulses supplied by television system 1.

Flip-flop multivibrator 17 remains in its active state for the whole time when the beam stays within the field limits.

The outputs of flip-flops multivibrators 11 and 17 are fed to gate 18 and generate the field control pulses.

The latter pulses are fed to the mixing circuit (linear gate 19) which substitutes for the analog signal from the television camera through line 501', the signal from memory 300 via line 501, so that the image stored in the memory after processing can be displayed on the monitor within field limits.

The function of dispatching unit 200 is that of making the frequency of the input signals from the A/D (analog/digital) converter compatible with the operating frequency of the 150-position MOS shift registers contained in memory 300. This requirement is dictated by the technical characteristics of the type of memory employed in the embodiment described herein, and should not be taken as a limitation of the principles forming the base of the patent. The principle upon which said unit is based is the conversion of a sequence of pulses into a sequence of 12-bit words, which are supplied successively in parallel and in an ordered manner to the said memory 300.

The module-12 electric pulse counter 20 counts the pulses supplied by AND gate 21 which transmits the pulses from synchronous clock 3 when cleared by AND gate 22, that is when the field control signal from circuit 18 and the writing control issued manually by the operator via line 206 are present.

Counter 20 is reset to zero whenever flip-flop multivibrator 11 switches, signalling the beginning of the line package, meaning the beginning of the first field line, by the signal supplied via line 201 from flip-flop multivibrator 11, suitably shaped by circuit 23. Whenever counter 20 has counted 12 pulses, it actuates flip-flop multivibrator 24 whose true Q and negated $\overline{Q}$ outputs gate the passage of the data issuing from gate 25 alternatively between gates 26 and 27. Circuit 25 allows the passage of data only when gated by circuit 22. Outputs Q and Q gate alternatively the passage of the clocking pulses through gates 28 and 29. Outputs Q and $\overline{Q}$ gate the two 12-gate groups 42 thrugh 53 and 44 through 55, which allow the passage of the data in parallel towards the integrated memory circuits 92 through 103. Finally, outputs Q and $\overline{Q}$ feed to shift registers 30 and 31 the signals that control their operation. In effect, when Q and Q cause shift register 30 to operate as a series data acquisition register, the data and clocking pulses are fed into said shift register 30 respectively through gates 26 and 28, while shift register 31 feeds them in parallel to gates 44 through 55 which are actuated. Similarly, when flip-flop multivibrator 24 changes its state, shift register 31 operates in series and shift register 30 operates in parallel.

The outputs from gates 32 through 43 are fed in pairs to the inclusive-OR circuits 56 through 67.

The MOS memory unit 300, at each repetition of a field scan dictated by the reading control, stores the data resulting from the comparison of the information from the television camera with the data previously stored in said memory.

Unit 300, in addition to the integrated memory circuits 92 through 103, also contains the circuits required to carry out the aforesaid comparison. The 12-bit words generated by dispatching unit 200 reach serially in an ordered manner comparison circuits 80 through 91 and 68 through 79. Simultaneously, into the same comparison circuits are fed the output signals from gates 104 through 115 which feed back the 12-bit ordered word suite previously stored in memories 92 through 103.

The outputs from inclusive-OR circuits 56 through 67 are fed into both inclusive-OR circuits 80 through 91 and exclusive-OR circuits 68 through 79. Circuits 68 through 79 output the exclusive-OR among the data at that time outputting from the memory, while circuits 80 through 91 output the inclusive-OR thereof.

The two-position, twelve-way switch (C) feeds into MOS memories 92 through 103 the data taken from circuits 68 through 79 or 80 through 91, depending on whether it is set to position B or position A.

The data appearing at the input of MOS memories 92 through 103 are recorded in correspondence with the MOS clocking signal from inclusive-OR 117 and shaper 118 via line 360.

At each new recording of 12 data in parallel in the 12 memories 92 through 103, the previously recorded data are shifted by one position towards the output. The last datum exits and, if the sum control 301 actuates gates 104 through 115, the following 12 data contained in the memory reappear at the input, for comparison with the datum fed from the television camera to the memory.

The function of positioning unit 400 is to synchronize the output of data from memory 300 with the input of data from the dispatching unit. This is achieved by feeding to memory 300 the pulses required to position the first 12-bit word corresponding to the sequence recorded during a previous processing at the output of the 12 MOS shift registers. The number of clocking pulses supplied to MOS 92 through 103 is controlled by counter 119. In effect, flip-flop multivibrator 120 is positioned by the trailing edge of the line-package-end pulse line 201 supplied by flip-flop multivibrator 11 and inverted by inverter 122 in such a way as to clear the passage of the pulses from the synchronous writing clock 3, suitably frequency-divided by circuit 121 through gate 116. The state of the flip-flop multivibrator 120 is changed only when counter 119 has counted the 150 pulses which ensure that the first datum that entered the 150-position shift registers 92 through 103 has reached the output and is therefore ready to be correlated with the first datum of a new reading.

Both flip-flop multivibrator 120 and counter 119 are reset to zero by the reading control through the ORs 123 and 124. OR 124 allows the resetting of counter 119 also when the memory-reading operation is initiated by the reading control.

The function of decoder unit 500 is to reconstitute from the ordered sequence of 12-bit words the pulse sequence ordered according to the television line scanning.

The reading control (line 314) and the clocking pulses (line 315) reaching gate 125 enable the reading of the data off the memory. The datum present at the output of memories 92 through 103 is transferred in parallel to shift register 126 which operates at parallel input under control by flip-flop multivibrator 127.

With the first clocking pulse supplied by gate 125 the state of flip-flop multivibrator 127 is changed and its output causes shift register 126 to operate in the serial mode; the same pulse resets the pulse counter 128. Gate 125 thus supplies the pulses that unload shift register 126 through gate 129 and that are fed out through gate 130. These pulses are counted by counter 128 which, when value 12 is reached, triggers through flip-flop multivibrator 127 a new parallel reading from MOS 92 through 103 and a new shifting of data within the said MOS 92 through 103, feeding the signal to OR 117 via line 503.

The data come out of the memory in the same order in which they were picked up by the line-scanning operation performed by the television camera.

The said data appear in the form of a sequence of pulses and the bit matrix is displayed by monitor 5', on which the efficiency of the acquisition can be checked by comparison.

The output of the system may be applied in the 0 to 10 Mc range and is therefore largely compatible with many data processing units.

The displaying on the monitor of the data stored in the memory is achieved by connecting the output of gate 129 to the input of linear gate 19 and using as an external clocking control the signal generated by gate 132. Gate 132 supplies the clocking pulses only when cleared by 202 (field control) and therefore the data emerge from the memory only when the monitor's electron beam is within the field of analysis.

What I claim is:

1. An apparatus intended to store in a digital memory the set of information obtained by comparing by means of a logical operator the information previously stored in the said memory with the information originating from a television camera, said television camera being capable of scanning a picture composed of a plurality of elementary areoles and of supplying at the output in the form of an electric signal an elementary information for each of the said areoles; the aforesaid apparatus comprising, in addition to the said television camera, a device for defining a field within said picture and for establishing a one-to-one correspondence between each elementary areole of said field and one storage location of a memory having at least as many locations as the areoles comprised within said field; at least one logical operator having two inputs and one output, whereof one input is connected to the output of said memory and the other input is connected to the television camera through analogic/digital converter and the output is connected to the memory input, the purpose of such arrangement being that of carrying out a logical comparison between the elementary information originating from the individual areoles within the television camera's field and the information originating from the corresponding storage location; a clock synchronous with the television camera's line pulses capable of causing the simultaneous arrival at the input of the aforesaid logical circuit of the elementary information originating from the corresponding storage location and the entering into the said storage location of the signal obtained from the comparison of the said information through the logical circuit.

2. An apparatus as per claim 1 above intended to store in a digital memory the plane projection of a trace or the plane projection of a trajectory, in which apparatus the aforesaid logical operator is made up by one inclusive-OR circuit and one exclusive-OR circuit parallel-connected to each other of which circuits one input is connected to the corresponding input of the other circuit and to the memory output, and the other input is connected, besides to the corresponding input of the other circuit, to the television camera through the aforesaid analog/digital converter, while a switch is fitted between the outputs of said circuits and the memory input, in such a manner that either of said OR circuits can be connected as desired to the memory input, the result of such arrangement being that when said switch is in inclusive-OR position, the apparatus will store in the memory the plane projection of a trace, the image of which is picked by the television camera on successively focused parallel planes, or the plane projection of a trajectory of an object the image of which is picked up by the television camera in successive positions, together with the background, that is the stationary object relative to which the object is moving, while in the exclusive-OR position the apparatus will store the plane projection of the trajectory of an object, excluding the stationary objects within the television camera picture frame.

3. A method intended to store in a digital memory the set of information obtained by comparing by means of a logical operator the information previously stored in the aforesaid memory with the information originating from a television camera, the latter being capable of scanning a picture composed of a plurality of elementary areoles and of delivering at the output in the form of an electric signal an elementary information for each of the aforesaid areoles, such method consisting of the following stages:
  delimiting a field within said picture;
  establishing a one-to-one correspondence between each of the areoles of the television camera's field and one of the storage locations;
  converting the analog signal originating from the television camera for each of the areoles of the camera's field into a digital signal;
  reading off the memory the signal relating to one given storage location when the television camera issues the signal relating to the areole corresponding to the said location;
  causing the said signal issuing from the television camera and the said signal issuing from the memory to be fed simultaneously to the inputs of the logical operator;
  entering into the memory in the said location the result of the comparison performed by the said logical operator between said signal issuing from the memory and the said signal issuing from the television camera.

4. A method intended to store in a digital memory the plane projection of the trace left by a particle in a transparent medium in which method use is made of a microscope whose images are picked up by a television camera, such method comprising the following stages;
  delimiting in the television camera's picture frame a field including the trace to be recorded;
  subdividing the said field into a grid of areoles corresponding to small sections of the lines of the television camera, obtaining on the output therefrom one signal for each areole;
  establishing a one-to-one correspondence between each of the said areoles and one storage location;
  focusing the microscope on different parallel layers of the medium containing the trace to be recorded;
  converting the analog signal issuing from the television camera for each of the areoles into which said field is subdivided into a digital signal;
  reading off the memory the information contained in the storage location corresponding to the areole which is scanned by the television camera at a given instant;
  causing the signal relating to a certain field areole and the signal read off the memory relating to the location corresponding to the said areole to be fed simultaneously to the inputs of an inclusive-OR logical operator;
  entering in the storage location referred to in the preceding point the signal issuing from the said logical operator, being the result of the comparison between the two signals simultaneously fed into the said operator.

5. A method intended to store in a digital memory the plane projection of the trajectory of a moving object, in which method use is made of an optical system capable of viewing the object along the said trajectory and of a television camera capable of picking up the images supplied by the said optical system, which method comprises the following stages;
  delimiting in the television camera's picture frame a field including the trace to be recorded;
  subdividing the said field into a grid of areoles corresponding to small sections of the lines of the television camera picture, obtaining on the output therefrom ones signal of each areole;
  establishing a one-to-one correspondence between each of the said areoles and one storage location;
  converting the analog signal issuing from the television camera for each of the areoles into which said field is subdivided into a digital signal;
  reading off the memory the information contained in the storage location corresponding to the areole which is scanned by the television camera at a given instant;

causing the signal relating to a certain field areole and the signal read off the memory relating to the location corresponding to the said areole to be fed simultaneously to the inputs of an inclusive-OR logical operator;

entering in the storage location referred to in the preceding point the signal issuing from the said logical operator, being the result of the comparison between the two signals simultaneously fed into the said operator.

6. A method intended to store in a digital memory the plane projection of the trajectory of a moving particle, the stationary objects with respect to which the said particle is moving being excluded, in which use is made of an optical system capable of viewing the object along the said trajectory and of a television camera capable of picking up the images supplied by the said optical system, which method comprises the following stages.

delimiting in the television camera's picture frame a field including the trace to be recorded;

subdividing the said field into a grid of areoles corresponding to small sections of the television camera's picture lines, obtaining on the output therefrom one signal for each areole;

establishing a one-to-one correspondence between each of the said areoles and one storage location;

converting the analog signal issuing from the television camera for each of the areoles into which said field is subdivided into a digital signal;

reading off the memory the information contained in the storage location corresponding to the areole scanned by the television camera at a given instant;

causing the signal issuing from the television camera and relating to a certain field areole and the signal read off the memory relating to the location corresponding to the said areole to be simultaneously fed to the inputs of an exclusive-OR logical operator;

entering in the storage location referred to in the preceding point the signal issuing from the said logical operator, being the result of the comparison of the two signals simultaneously fed into the said operator.

* * * * *